United States Patent [19]

Markison

[11] 4,054,861

[45] Oct. 18, 1977

[54] PULSING TYPE HALL EFFECT ROTARY SWITCH

[75] Inventor: William C. Markison, Crystal Lake, Ill.

[73] Assignee: Oak Industries Inc., Crystal Lake, Ill.

[21] Appl. No.: 733,114

[22] Filed: Oct. 18, 1976

[51] Int. Cl.² .......................................... H01L 43/04
[52] U.S. Cl. ................................. 338/32 H; 200/291
[58] Field of Search ........................ 338/32 R, 32 H; 323/94 H; 324/45, 46; 335/1, 2, 205-207; 200/291

[56] References Cited

U.S. PATENT DOCUMENTS

| | | | |
|---|---|---|---|
| 3,018,395 | 1/1962 | Carlstein | 323/94 H X |
| 3,185,920 | 5/1965 | Brunner | 323/94 H |
| 3,671,854 | 6/1972 | Masuda | 323/94 H |
| 3,893,059 | 7/1975 | Nowak | 323/94 H |

*Primary Examiner*—C. L. Albritton
*Attorney, Agent, or Firm*—Kinzer, Plyer, Dorn & McEachran

[57] ABSTRACT

A Hall effect rotary switch includes a frame and a parallel rotor and stator mounted in the frame. There are a plurality of peripherally unequally spaced Hall effect sensing circuits mounted on the stator and a plurality of localized magnetic areas on the rotor. Movement of the magnetic areas adjacent the Hall effect sensing circuits provides output signals therefrom, which signals are used to determine the relative position of the rotor and stator. The localized magnetic areas on the rotor cooperate with detent portions of the stator to form a magnetic detent.

9 Claims, 6 Drawing Figures

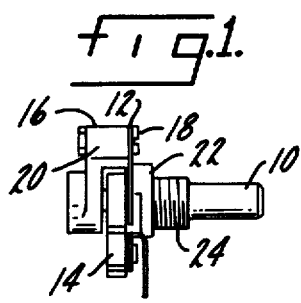
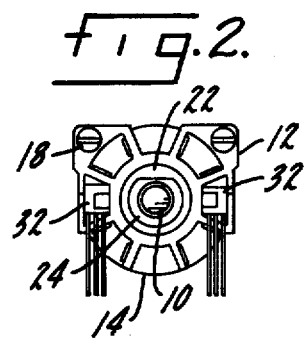
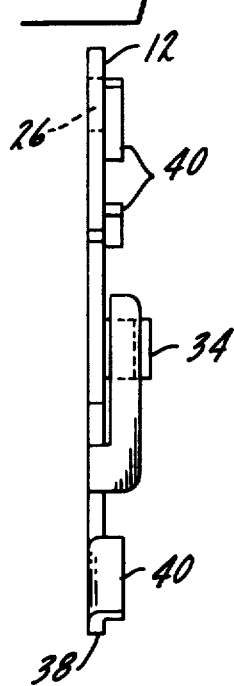
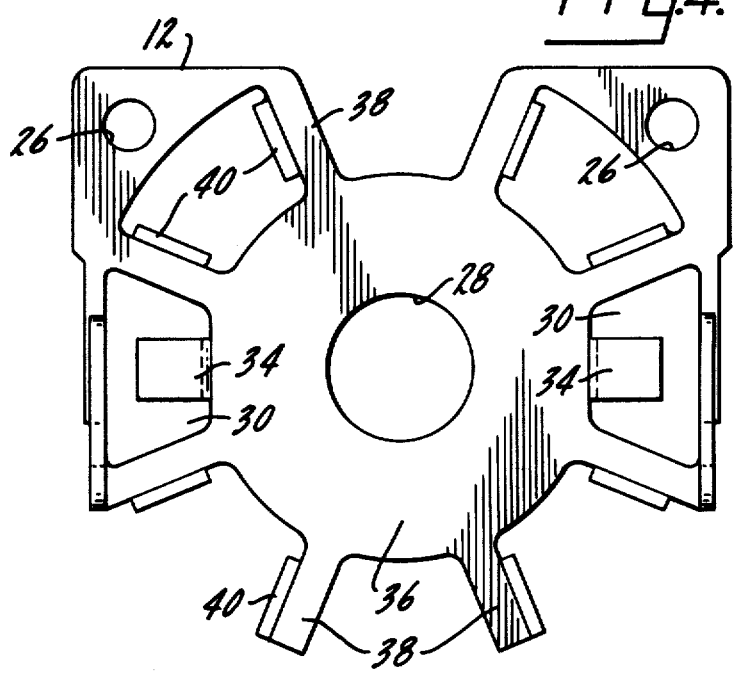
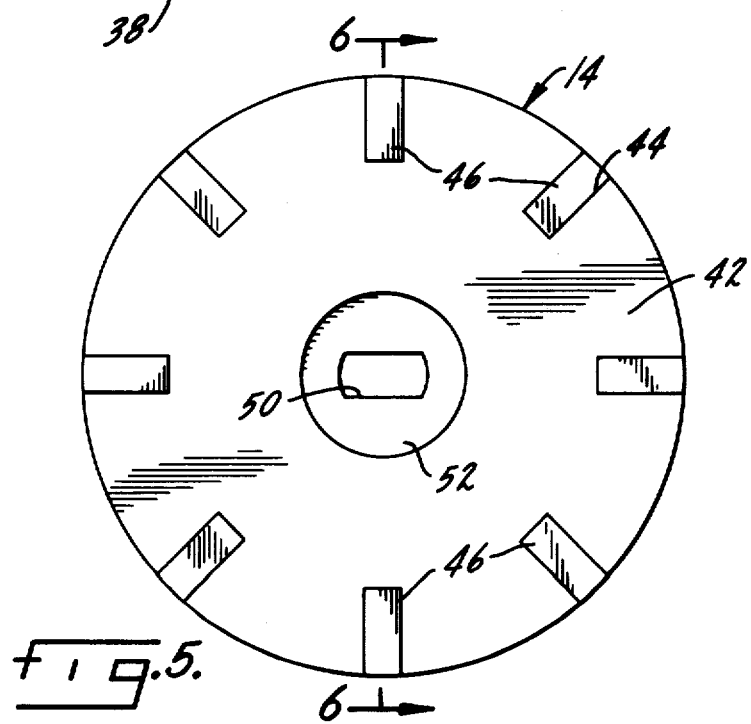
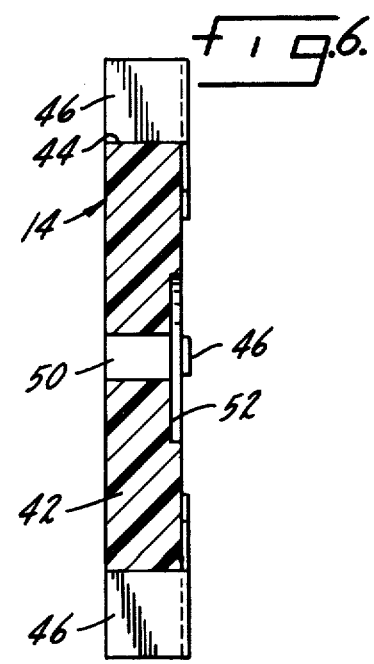

PULSING TYPE HALL EFFECT ROTARY SWITCH

SUMMARY OF THE INVENTION

The present invention relates to a Hall effect rotary switch and in particular to a simply constructed reliably operable switching device of the type described.

A primary purpose of the invention is a rotary switch using a pair of unequally spaced Hall effect sensing circuits on the stator and a rotor having a series of localized magnetic areas. Movement of the rotor past the stator Hall effect sensing circuits provides output signals therefrom, which output signals are utilized in electronic circuitry to indicate switch position.

Another purpose is a switching device of the type described in which the rotor magnetic areas cooperate with portions of the stator to form a magnetic detent.

Another purpose is a switching device of the type described in which the Hall effect sensing circuits are variably positioned within stator pockets.

Other purposes will appear in the ensuing specification, drawings and claims.

BRIEF DESCRIPTION OF THE DRAWINGS

The invention is illustrated diagrammatically in the following drawings wherein:

FIG. 1 is a side view of a switching device of the type described,

FIG. 2 is a plan view of the switching device,

FIG. 3 is an enlarged side view of the stator,

FIG. 4 is an enlarged plan view of the stator,

FIG. 5 is an enlarged plan view of the rotor, and

FIG. 6 is a section along plane 6—6 of FIG. 5.

DESCRIPTION OF THE PREFERRED EMBODIMENT

The present invention utilizes Hall effect sensing circuits in which the presence of an adjacent magnet field is effective to provide an output current from the sensing circuit. The particular type of Hall effect sensing circuit may vary, although the ULN-3006 manufactured by Sprague Electric Company has been found to be satisfactory for purposes of the present switch. This particular semiconductor chip includes a voltage regulator, a Hall effect sensor, a Schmitt trigger circuit, and an output amplifier. The Hall effect sensing circuits are mounted on the switch stator and there are preferably two such circuits unequally peripherally spaced apart. Movement of localized magnetic areas on the switch rotor adjacent the sensing circuits provides output pulses therefrom with the number of pulses and relative timing of the two pulse ouputs indicating, through the use of auxiliary electronic circuits, the direction of movement of the rotor.

A switch shaft is indicated generally at 10 and extends through a stator 12 and a rotor 14. A frame 16, somewhat triangular in shape, mounts stator 12 with the frame having a pair of spaced bosses 20 with holes for mounting screws 18 which hold the stator to the frame. Stator 12 may have a generally centrally located integral boss 22 which will mount a conventional threaded sleeve 24 for use in attaching the switch to an instrument panelor the like.

Stator 12 includes openings 26 for mounting screws 18 as described above, and a generally central opening 28 for switch threaded sleeve 24. On diammetrically opposite sides of stator 12 are pockets 30 for use in positioning Hall effect sensing circuits 32. The bottom of the pockets are partially closed by small supports 34. Hall effect sensing circuits 32 will be variably positioned within the pockets so that there is unequal peripheral spacing between them. In this way pulses from the two sensing circuits will have a small time differential which indicates the direction of rotor movement. As can be clearly seen from FIGS. 2 and 4, pockets 30 are larger than Hall effect sensing circuits 32, providing the variable positioning described above, with difference in positions of determining the time differential between the output signals from the two sensing circuits.

Stator 12 is in the form of a spider having a central body portion 36 and a plurality of outwardly-extending arms 38. There are eight such arms and each arm has an integrally formed detent member 40 which extends away from rotor 14 when the switch is assembled. Since the spider is made of a magnetically active material, for example a suitable metal, detent members 40 and arms 38 will interact with the rotor magnets as described hereinafter to provide a switch index arrangement.

Rotor 14, indicated in FIGS. 5 and 6, is in the form of a non-conductive disc 42, having a plurality of equally spaced slots 44. A magnet 46 is positioned within each slot. In the alternative, the rotor may be formed of a plastic material with magnetic particles embedded in it, with selective areas magnetized to form specific localized magnetic areas adjacent the periphery of the rotor. In either event, the rotor is basically a disc with localized magnetic areas positioned to pass adjacent the Hall effect sensing circuits when the coplanar rotor and stator are mounted within switch frame 16.

In addition to performing a switching function by providing output pulses from Hall effect sensing circuits 32 when they pass by the sensing circuits, the magnetic areas cooperate with integral detent members 38 and 40 of the stator to provide a switch index. The magnetic interaction between members 38 and 40 and the magnets is effective to hold the rotor in any particular switch position. The rotor may be easily moved relative to the stator by applying a normal rotary force as is common with mechanically detented switches.

Rotor 14 includes a central double D opening 50 for mounting switch shaft 10 and there may be a small recess 52 which accomodates a shoulder on the switch shaft 10 when the switch structure is assembled.

Of importance in the invention is the use of a pair of peripherally unequally spaced Hall effect sensing circuits which provide output pulses indicative of movement of the rotor relative to the stator, which output pulses, being spaced apart on a time basis, through auxiliary circuitry, indicate direction of movement. The same magnetic areas on the rotor cooperate with integral detent members on the stator to provide a detent or index construction.

The switch shown and described has certain advantages inherent in the elimination of mechanical contact between the rotor and stator, particularly a switch with exceptionally long life and one with no opportunity for poor electrical contact or short circuits.

Whereas the preferred form of the invention has been shown and described herein, it should be realized that there may be many modifications, substitutions and alterations thereto.

The embodiments of the invention in which an exclusive property or privilege is claimed are defined as follows:

1. A Hall effect rotary switching device including a rotor and a stator, a plurality of peripherally unequally spaced Hall effect sensing circuits on said stator, a plurality of localized magnetic areas on said rotor, a switch frame for said rotor and stator and mounting said rotor to move said localized magnetic areas adjacent said Hall effect sensing circuits, with such movement causing output signals therefrom, and cooperating magnetic detent means on said rotor and stator including said rotor localized magnetic areas.

2. The structure of claim 1 further characterized in that said cooperating magnetic detent means include a plurality of detent members integrally formed with said stator and extending away from said rotor.

3. The structure of claim 2 further characterized in that there are an equal number of rotor localized magnetic areas and stator detent members.

4. The structure of claim 3 further characterized in that said stator is in the form of a spider having a central area and a plurality of outwardly extending arms, said detent members being formed integrally with said arms.

5. The structure of claim 1 further characterized in that said stator includes a pair of peripherally spaced pockets, said Hall effect sensing circuits being positioned within said pockets.

6. The structure of claim 1 further characterized in that said rotor includes a non-conductive disc, a plurality of peripheral slots in said disc, and a magnet positioned within each slot.

7. The structure of claim 1 further characterized in that said rotor and stator are generally coplanar, and a rotor shaft extending through coaxial openings in said rotor and stator.

8. The structure of claim 7 further characterized in that said stator includes a generally central body and a plurality of outwardly-extending arms, and detent means carried by said stator arms and cooperating with the localized magnetic areas on said rotor to form a magnetic detent.

9. A Hall effect rotary switch including a rotor and a stator, a plurality of peripherally spaced Hall effect sensing circuits on said stator, a plurality of localized magnetic areas on said rotor, a switch frame mounting said rotor for movement adjacent said stator with movement of said localized magnetic areas adjacent said Hall effect sensing circuits causing output signals therefrom, a plurality of detent members on said stator peripherally spaced from said Hall effect sensing circuits, said detent members and said localized magnetic areas cooperating to form a switch detent.

* * * * *